United States Patent
Wyse

(10) Patent No.: US 9,531,334 B1
(45) Date of Patent: Dec. 27, 2016

(54) BROADBAND CIRCUIT FOR AN ACTIVE DEVICE

(75) Inventor: Russell D. Wyse, Center Point, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 131 days.

(21) Appl. No.: 13/529,415

(22) Filed: Jun. 21, 2012

(51) Int. Cl.
*H03F 3/191* (2006.01)
*H03F 3/45* (2006.01)
*H03H 7/075* (2006.01)
*H01L 23/64* (2006.01)

(52) U.S. Cl.
CPC ............ *H03F 3/191* (2013.01); *H01L 23/645* (2013.01); *H03F 3/45475* (2013.01); *H03F 2200/36* (2013.01); *H03F 2203/45652* (2013.01); *H03H 7/075* (2013.01)

(58) Field of Classification Search
CPC .. H03F 2200/36; H03F 2200/39; H03F 3/191; H03F 2203/45652; H03F 2203/45361; H03F 2203/45704; H03F 2203/45178; H03F 2203/45434; H03F 3/45475; H03F 3/265; H03H 7/075; H01L 23/645
See application file for complete search history.

(56) References Cited

U.S. PATENT DOCUMENTS

| 6,107,885 | A * | 8/2000 | Miguelez ............... H03F 3/265 330/276 |
| 7,400,196 | B2 * | 7/2008 | Wyatt ...................... H03F 1/42 330/258 |
| 7,423,490 | B2 * | 9/2008 | Ma ......................... H03H 7/075 330/297 |
| 2006/0061415 | A1* | 3/2006 | Bhattacharjee et al. ...... 327/563 |
| 2007/0024377 | A1* | 2/2007 | Wang et al. ................. 330/305 |
| 2007/0229168 | A1* | 10/2007 | Ma et al. ..................... 330/297 |

OTHER PUBLICATIONS

Lux, Pi and T networks, 2002, http://home.earthlink.net/~w6rmk/math/wyedelta.htm.*
RF Circuit Design (selected pages), John Wiley & Sons, Inc., 2008, ISBN: 9780470167588.*
Agilent, Balanced Device Charac, 2002 http://web.doe.carleton.ca/~nagui/Appnotes/Agilent/NetworkAnalyzer/EPSG084733.pdf.*

* cited by examiner

*Primary Examiner* — Ping Hsieh
*Assistant Examiner* — James Yang
(74) *Attorney, Agent, or Firm* — Daniel M. Barbieri; Donna P. Suchy; Angel N. Gerdzhikov

(57) ABSTRACT

A circuit includes a de-Qing network coupled in parallel between a first and a second series-coupled reactive network. The de-Qing network is sized to lower the quality factor of the second reactive network. The first reactive network is a low valued inductor, which is sized for modifying high frequency signals. The second reactive network is a high valued inductor, which is sized for modifying low frequency signals. The de-Qing network can be a resistor or combination of resistors, inductors, and capacitors.

20 Claims, 2 Drawing Sheets

BROADBAND CIRCUIT FOR AN ACTIVE DEVICE

BACKGROUND

The present invention is directed toward an active RF circuit. More particularly, the present invention is directed to increasing the frequency range for maximum linear performance that an active RF circuit can achieve.

Integrated circuits (ICs) are typically assembled in small blocks of semiconducting material known as dies. ICs are produced in large batches on a single wafer, which is cut into many pieces, each of which is a copy of the IC. Each of these pieces is called a die.

Due to cost and size constraints, it is generally desirable to pack as large a number of electronic devices and circuits onto a die as possible, while keeping the size of the die as small as possible. In radio frequency (RF) applications for low frequency operation large valued inductors and capacitors are often needed. While an RF circuit can easily be broad banded by utilizing resistive chokes, the voltage drop across the resistors, caused by the bias current in the IC, reduces the amount of voltage swing, and hence the linear performance, that the RF circuit can produce. Inductive chokes are useful for large signal devices, but inductors have limited frequency coverage ranges and take up precious die area that could be used for building additional circuits, so they are often positioned off-die. The path length between the on-die and off-die components, however, increases the parasitic reactance in the circuit.

SUMMARY

According to the present invention, there is provided a circuit, which includes a de-Qing network coupled in parallel between a first and a second series-coupled reactive networks. The de-Qing network is sized to lower the Q (quality) factor of the second or adjacent reactive network by decreasing the resonance interaction that arises as it enters its undesired frequency range where its behavior is dominated by its parasitic properties. For example, utilizing an RF choke feed which passes DC but blocks RF, the first reactive network can be a low valued, low impedance inductor, which is sized for blocking high frequency signals and can be placed on die for optimum high frequency behavior where the wavelengths of the RF signal are the smallest. The second reactive network can be a high valued inductor, which is sized for blocking low frequency signals. The low frequency RF signals have long wavelengths so the high valued inductor can be placed off die without impacting the low frequency behavior. The de-Qing network can be a resistor or a combination of resistors, capacitors, and inductors.

In an embodiment, a semiconductor die is provided. The active device and the first reactive network are positioned on the die. The second reactive network is positioned apart from the die. The de-Qing network can be positioned on-die or off-die.

In another embodiment, an RF circuit is provided. The RF circuit includes an active device, a first reactive network coupled to the output of the active device, a second reactive network coupled in series with the first reactive network, and a de-Qing network coupled in parallel between the first reactive network and the second reactive network. The first reactive network can be a low valued inductor sized for blocking high frequency signals and is series-coupled to the second reactive network, which can be a high valued inductor sized for blocking low frequency signals. The de-Qing network can be a resistor, which is sized to lower the interaction of the second reactive network at frequencies beyond its resonant frequency.

In yet another embodiment, a method is disclosed for modifying an RF signal. An RF signal is received at an active device. A first reactive network, which is coupled to the output of the active device, modifies high frequency signals. A second reactive network, which is coupled in series with the first reactive network, modifies low frequency signals. A de-Qing network coupled in parallel between the first and the second reactive networks lowers impedance of the second reactive network at frequencies beyond the second reactive network's resonant frequency.

These and other aspects, features, and advantages of the invention will become apparent upon review of the following description taken in connection with the accompanying drawings. The invention, though, is pointed out with particularity by the appended claims.

DESCRIPTION OF THE ILLUSTRATIVE EMBODIMENTS

Figure 1:
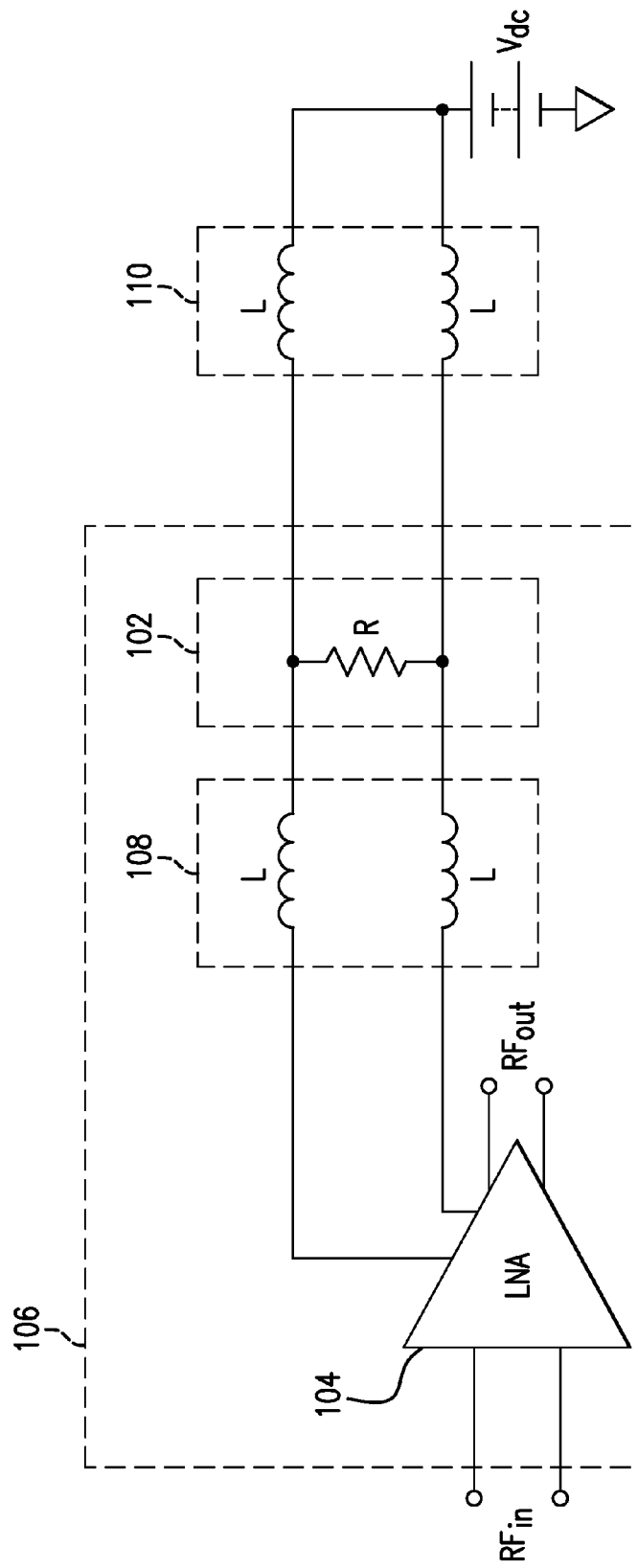
FIG. 1 is a schematic diagram of an active device coupled to a de-Qing network that is coupled in parallel between a first and a second series-coupled reactive networks in accordance with the present invention.

FIG. 1 shows a de-Qing network 102 which passes direct current (DC) for an active device 104 with minimal voltage overhead penalty so a maximum linear range of operation for active device 104 can be achieved. The linear range of operation is the range of input values for which active device 104 produces an output signal that is a generally linear function of the input signal. For purposes of this disclosure, the desirable linear range of operation extends generally to the 1 dB compression point, i.e. where the output power is 1 dB less than the small signal gain, although a higher compression point may be tolerable.

More specifically, FIG. 1 shows active device 104 adapted to amplify an RF signal across a wide frequency range. In this implementation, active device 104 is formed on a die 106, and coupled to an on-die reactive network 108, which is sized for blocking high-frequency RF signals. An off-die reactive network 110, which is sized for blocking low-frequency RF signals, is coupled in series to reactive network 108. De-Qing network 102, which is sized to reduce the interaction of the parasitic behavior that arises in reactive network 110 at high frequencies, is coupled in parallel between reactive networks 108 and 110.

The combination of de-Qing network 102 coupled in parallel between the series coupled on-die reactive network 108 and off-die reactive network 110 forms a ladder network that passes the DC bias current with minimal voltage overhead penalty and provides a larger frequency range where the RF signal is blocked from the supply rail and forced to go out the desired RF voltage output path.

In the illustrated embodiments, reactive networks 108 and 110 each include a single differential inductor pair; however, one skilled in the art would understand that either reactive network 108 or 110 could be a combination of resistors, inductors, and/or capacitors. For example, DC blocking capacitors can be added to off-die reactive network 110 to extend the lower operating frequency range. Furthermore, multiple reactive networks can be cascaded in series with a de-Qing network 102 between each reactive network, and thereby extending the ladder network to incrementally pass pre-defined frequency ranges, for example by creating a low, medium, and high frequency range, or any other combination of ranges.

An ideal inductor has an impedance (Z) that is purely reactive and proportional to the inductance (L) and frequency (f). The phase is always 90 degrees out of phase with the applied voltage, so there is no effect from the DC current bias on the ideal inductor. In practice, however, the inductor has a dominant resistive element at low frequencies, and a parasitic capacitance, at high frequencies caused from resonance. Further parasitics arise from inherent DC resistance and capacitance in the structure, for example, bond wires add inductance, and board level traces and pads for placing the inductors and capacitors add undesired capacitance and inductance. Such parasitics cause the behavior of an inductor to be non-ideal over its frequency range. These non-ideal resistive and capacitive characteristics in the inductor create a resonant frequency. If the resonant frequency is within the frequency of the desired operation undesired behavior can occur such as a drop in gain, i.e. "suck-out," causing RF system performance issues.

The quality factor (Q factor) is widely used to characterize resonant circuits. The Q factor of a circuit is the peak energy stored in the circuit divided by the average energy dissipated in it per cycle at resonance. High Q circuits tend to have sharp, narrow, rapidly changing frequency band characteristics. Low Q circuits tend to have shallow, broader, slower changing frequency characteristics.

In order to combat the resonance in reactive network 110 at high frequencies (where it would be have like a capacitor), a circuit network that lowers the Q factor, i.e. a de-Qing network, is provided. De-Qing network 102 is coupled in parallel between reactive network 108 and reactive network 110 to lower the Q factor of each reactive network 108, 110. De-Qing network 102 has a floating virtual ground due to the differential nature of active device 104. The virtual ground improves the balance in the RF circuit's characteristics. De-Qing network 102 can be a resistor that lowers the impedance variation of reactive network 110 by limiting the high frequency, parasitic capacitance that arises in reactive network 110. While the illustrated embodiment discloses de-Qing network 102 as a single resistor, de-Qing network 102 can be a combination of resistors, inductors, and/or capacitors. The implementation of de-Qing network 102 depends on the operating range for active device 102 and the implementation of reactive networks 108 and 110.

Figure 2:
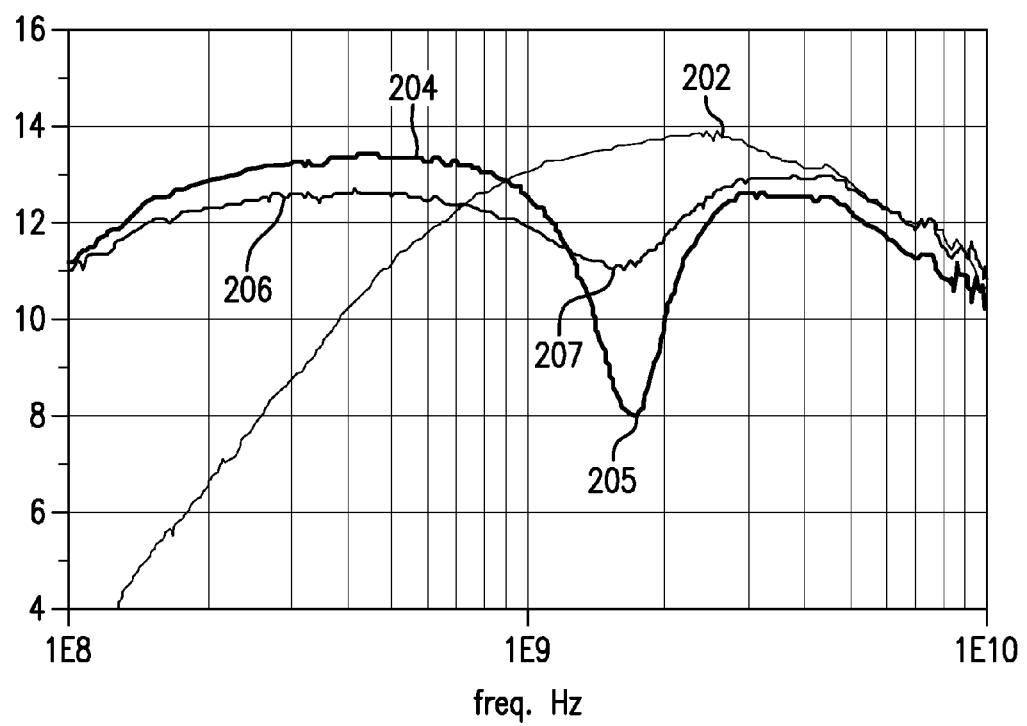
FIG. 2 is a graph comparing the gain response of the active device in three configurations: the first configuration is without any external chokes; the second configuration is with a resistor in parallel with each external choke; and the third configuration is in accordance with the embodiment of the invention shown in FIG. 1.

FIG. 2 shows the measured gain response of active device 104 from 100 MHz to 10 GHz in various implementations. Plot 202 shows the gain response for on-die active device 104 coupled to on-die reactive network 108, but without de-Qing network 102 or off-die reactive network 110. At the low frequency end, the active device 104 has no gain, which renders this implementation undesirable for receiving low frequency signals.

Plot 204 shows the classic prior-art approach of the gain response for on-die active device 104 coupled to on-die reactive network 108 and off-die reactive network 110 with resistors in parallel with each inductor, but without de-Qing network 102. This implementation has acceptable gain at the low and high ends, but in the middle, there is a suck-out 205 where the gain drops. Because suck-out 205 is within the desired frequency band, this implementation is undesirable for broadband applications. The balanced differential behavior is also reduced by this approach due to board and die layout imperfections that limit the absolute phase balance of a differential circuit.

Plot 206 shows the gain response for on-die active device 104 coupled to on-die reactive network 108 and off-die reactive network 110 with de-Qing network 102 coupled in parallel, therebetween. This implementation has acceptable gain (+−1 dB) across its frequency range. Suck-out 207 is decreased as compared to suck-out 205 due to de-Qing network 102 lowering the maximum impedance of the circuit by canceling the high-frequency, parasitic capacitance that arises in reactive network 110. The balanced behavior is also maximized due to the virtual ground behavior allowed by the parallel ladder approach of de-Qing network 102 as evidenced by the better amplitude balance between the low and high end frequency range.

The illustrated embodiment was designed for an operating range of 100 MHz to 10 GHz. Suck-out 207 shows generally the separation between "high frequency" and "low frequency" signals. On-die reactive network 108 is sized with a pair of 18 nH inductors for blocking high-frequency RF signals. Off-die reactive network 110 is sized with a pair of 100 nH inductors for blocking low-frequency RF signals. One skilled in the art would understand that the size of the inductors in reactive networks 108, 110 depend on the frequency coverage goals for the circuit, and the size constrains for the on-die components. The main goal is that off-die reactive network 110 has a significantly higher inductance than on-die reactive network 108, so that it will resonate at a lower frequency.

Active device 104 can be any active RF device, including, but not limited to, an amplifier or attenuator, a power amplifier, a low-noise amplifier, or a mixer. The components on die 106 are constructed with a combination of discrete components, including transistors and inductors. Transistors in active device 104 can be made using various fabrication technologies, such as silicon (SI) substrate, silicon-germanium (Si—Ge) substrate, gallium arsenide (GaAs) substrate, or gallium-nitride (GaN) on a silicon substrate. Various types of transistors are available, including a bipolar terminal transistor (BJT), metallic oxide semiconductor (MOS), complementary metallic oxide semiconductor (CMOS), a bipolar CMOS (Bi-CMOS), heterojunction bipolar transistor (HBT), metal semiconductor field effect transistor (MESFET) and high electron mobility transistor (HEMT).

While the present invention has been particularly shown and described with reference to exemplary embodiments thereof, it should be understood by those of ordinary skill in the art that various changes, substitutions and alterations could be made herein without departing from the scope of the invention as defined by appended claims and their equivalents.

What is claimed is:

1. A circuit for maximizing linear range and frequency coverage for an active device, the circuit comprising:
   the active device comprising a pair of RF input ports for receiving an RF input, a pair of RF output ports for providing an RF output that is a linear function of the RF input at the RF input ports, and a first DC bias control port and a second DC bias control port for providing a DC bias current to the active device;
   a first reactive network having a first impedance coupled to the first DC bias control port of the active device and a second impedance coupled to the second DC bias control port of the active device, the first reactive network for substantially blocking high frequency radio frequency (RF) signals;

a second reactive network having a first impedance coupled to the first impedance of the first reactive network and a second impedance coupled to the second impedance of the first reactive network, the second reactive network for substantially blocking low frequency RF signals, wherein the first reactive network and the second reactive network are configured independent of each other;

a de-Qing network selected from the group consisting of a resistive de-Qing network and an inductive de-Qing network, the de-Qing network coupled in parallel between the first reactive network and the second reactive network between the first impedance and the second impedance of the first reactive network, the de-Qing network being sized to lower a quality factor of the first and the second reactive networks and including a floating virtual ground between the first impedance and the second impedance of the first reactive network; and a DC source connected to the second reactive network to supply the active device with a DC bias current.

2. The circuit of claim 1, wherein the de-Qing network lowers a maximum impedance of the second reactive network at the second reactive network's resonant frequency.

3. The circuit of claim 2, wherein the first reactive network and the second reactive network are series-coupled.

4. The circuit of claim 3, wherein the de-Qing network is a resistor.

5. The circuit of claim 4, wherein the first reactive network is a low valued inductor sized for blocking high frequency signals.

6. The circuit of claim 5, wherein the second reactive network is a high valued inductor.

7. The circuit of claim 1, and further comprising a die including the active device and the first reactive network.

8. The circuit of claim 7, wherein the second reactive network is positioned apart from the die.

9. The circuit of claim 8, wherein the de-Qing network is a resistor.

10. The circuit of claim 9, wherein the de-Qing network is positioned apart from the die.

11. The circuit of claim 9, wherein the de-Qing network is on the die.

12. The circuit of claim 9, wherein the active device is a mixer.

13. The circuit of claim 9, wherein the active device is an amplifier.

14. An RF circuit comprising:
an active device having a pair of RF input ports for receiving an RF input, a pair of RF output ports for providing an RF output that is a linear function of the RF input at the RF input ports, a first DC bias control port and a second DC bias control port for providing a DC bias current to the active device;

a first reactive network having a first impedance coupled to the first DC bias control port of the active device and a second impedance coupled to the second DC bias control port of the active device, the first reactive network for substantially blocking high frequency radio frequency (RF) signals;

a second reactive network having a first impedance coupled to the first impedance of the first reactive network and a second impedance coupled to the second impedance of the first reactive network, the second reactive network for substantially blocking low frequency RF signals, wherein the first reactive network and the second reactive network are configured independent of each other, and wherein the second impedance is larger than the first impedance;

a non-capacitive de-Qing network coupled in parallel between the first reactive network and the second reactive network between the first impedance and the second impedance of the first reactive network, the non-capacitive de-Qing network being sized to lower a maximum impedance of the second reactive network at the second reactive network's resonant frequency and including a floating virtual ground between the first impedance and the second impedance of the first reactive network; and a DC source connected to the second reactive network to supply the active device with a DC bias current.

15. The RF circuit of claim 14, wherein the first reactive network wherein the first reactive network is a low valued inductor sized for modifying high frequency signals and is series-coupled to the second reactive network, which is a high valued inductor sized for modifying low frequency signals.

16. The RF circuit of claim 15, wherein the non-capacitive de-Qing network is a resistor.

17. The RF circuit of claim 16, and further comprising a die including the active device and the first reactive network.

18. The RF circuit of claim 17, wherein the second reactive network is positioned apart from the die.

19. A method for modifying a radio frequency (RF) signal comprising:
receiving the RF signal at an input port of an active device;

substantially blocking high RF signals with a first reactive network on a die that has a first impedance that is coupled to a first DC bias control port of the active device and a second impedance that is coupled to a second DC bias control port of the active device;

substantially blocking low RF signals with a second reactive network that is positioned apart from the die and has a first impedance that is series-coupled to the first impedance of the first reactive network and a second impedance that is series-coupled to the second impedance of the first reactive network, wherein the first reactive network and the second reactive network are configured independent of each other;

lowering a maximum impedance of the second reactive network at the second reactive network's resonant frequency by decreasing a parasitic capacitance that arises in the second reactive network with a non-capacitive de-Qing network that includes a virtual ground that is positioned in parallel between the first reactive network and the second reactive network between the first impedance and the second impedance of the first reactive network;

providing a DC bias current from a DC source connected to the second reactive network; and providing an RF output port for providing an RF signal that is a linear function of the RF signal at the input port.

20. The method of claim 19, and further comprising positioning the active device on the die.

* * * * *